(12) United States Patent
Seidel

(10) Patent No.: US 11,947,185 B2
(45) Date of Patent: Apr. 2, 2024

(54) AUTOFOCUSING METHOD FOR AN IMAGING DEVICE

(71) Applicant: Carl Zeiss SMT GmbH, Oberkochen (DE)

(72) Inventor: Dirk Seidel, Jena-Leutra (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 243 days.

(21) Appl. No.: 17/521,230

(22) Filed: Nov. 8, 2021

(65) Prior Publication Data

US 2022/0057598 A1 Feb. 24, 2022

Related U.S. Application Data

(63) Continuation of application No. PCT/EP2020/025213, filed on May 8, 2020.

(30) Foreign Application Priority Data

May 9, 2019 (DE) .......................... 102019112156.6

(51) Int. Cl.
  *G03F 7/20* (2006.01)
  *G02B 7/28* (2021.01)
  (Continued)

(52) U.S. Cl.
  CPC ............. *G02B 7/28* (2013.01); *G02B 21/244* (2013.01); *G03F 1/70* (2013.01); *G03F 9/7026* (2013.01); *H04N 23/671* (2023.01)

(58) Field of Classification Search
  CPC ........... G02B 7/28; G02B 21/244; G03F 1/70; G03F 9/7026; H04N 23/671; H04N 23/67
  See application file for complete search history.

(56) References Cited

U.S. PATENT DOCUMENTS

| 2004/0105000 A1 | 6/2004 | Yuri |
| 2008/0283722 A1 | 11/2008 | Uchiyama et al. |

(Continued)

FOREIGN PATENT DOCUMENTS

| DE | 102008005356 | 7/2009 | ............. G02B 21/24 |
| JP | H09-246356 | 9/1997 | ............. H01L 21/68 |

(Continued)

OTHER PUBLICATIONS

An Office Action issued by the German Patent Office for Application No. DE 10 2019 112 156.6, dated Jan. 15, 2020 (with English Translation).

(Continued)

*Primary Examiner* — Mesfin T Asfaw
(74) *Attorney, Agent, or Firm* — Fish & Richardson P.C.

(57) ABSTRACT

The invention relates to an autofocusing method for an imaging device (for semiconductor lithography) comprising an imaging optical unit, an object to be measured and an autofocusing device having a reflective illumination, comprising the following method steps:

a) defining at least three basis measurement points $M(x_j, y_j)$ on a surface of the object,
b) determining the deviation $A_{z(M)j}$ of a nominal position of the surface of the object from the focal plane of the autofocusing device at the defined basis measurement points $M(x_j, y_j)$,
c) storing the deviations $A_{z(M)j}$ from at least three basis measurement points $M(x_j, y_j)$,
d) using the stored deviation $A_{z(M)j}$ for determining a deviation $A_{z(P)k}$ at an arbitrary point $P(x_k, Y_k)$ of the surface, and
e) using the deviation $A_{z(P)k}$ for focusing onto the point $P(x_k, Y_k)$.

20 Claims, 2 Drawing Sheets

(51) Int. Cl.
   *G02B 21/24*   (2006.01)
   *G03F 1/70*   (2012.01)
   *G03F 9/00*   (2006.01)
   *H04N 23/67*   (2023.01)

(56) References Cited

U.S. PATENT DOCUMENTS

2014/0240687 A1    8/2014  Sato
2017/0324895 A1*  11/2017  Bryll .................... H04N 23/62
2018/0373013 A1   12/2018  Okawa

FOREIGN PATENT DOCUMENTS

JP    H10-261567    9/1998   ........... H01L 21/027
JP    2014-165284   9/2014   ........... H01L 21/027

OTHER PUBLICATIONS

The International Search Report and Written Opinion of the International Searching Authority for International Application No. PCT/EP2020/025213, dated Aug. 17, 2020.
The Office Action issued by the Japanese Patent Office for Application No. JP 2021-566467, dated Jan. 5, 2023 (with English Translation).

* cited by examiner

AUTOFOCUSING METHOD FOR AN IMAGING DEVICE

CROSS-REFERENCE TO RELATED APPLICATIONS

This application is a continuation of and claims priority under 35 U.S.C. § 120 from PCT Application No. PCT/EP2020/025213, filed on May 8, 2020, which claims priority from German Application No. 10 2019 112 156.6, filed on May 9, 2019. The entire contents of each of these priority applications are incorporated herein by reference.

TECHNICAL FIELD

The invention relates to an autofocusing method for an imaging device.

BACKGROUND

In the metrology of objects such as substrates which can be embodied as photomasks in the semiconductor industry, for example, in many measuring machines the object has to be brought into the focus of the imaging system in order to obtain a sharp image of the object or partial regions thereof, the so-called field of view (FoV). A plurality of partial regions of the object are usually measured, wherein the object has to be refocused for each partial region, that is to say that the surface has to be positioned into the focus of the imaging device. In order to ensure a high throughput, this focusing is intended to take place as fast as possible, that is to say with the fewest possible test measurements. One type of focusing known in the prior art, in which in the imaging direction (z-axis) a region around the expected focus, which is also referred to as defocus region, is measured with many individual images and from the latter the sharpest image and thus the focus are determined, does not satisfy the conditions in respect of throughput. After the elimination of all known machine parameters, such as wavelength deviation of the illumination light or positioning errors of the object, the region in which the focus is intended to be found is only the unknown thickness and surface shape of the object. This region in the z-direction in which the focus is intended to be found is a few μm in size. For current metrology tools, the accuracy of the autofocus measurement is intended to be of the order of magnitude of 1 nm to 50 nm.

The German patent DE10 2008 005 356 B4 discloses an autofocusing method with an autofocusing device comprising a dedicated imaging optical unit. An inclined, structured autofocus substrate, such as a grating, for example, is introduced into the beam path of the autofocusing device in such a way that an image of the grating is reflected on the photomask, as a result of which the illumination beam path is folded. The image of the grating is imaged firstly into a second focal plane and from there onto a camera, such as a CCD camera, for example. The inclination of the grating in the beam path results in a contrast of the grating structures on the substrate that is variable over the image in the image field that is imaged. From the location of the contrast maximum of the contrast variation over the image field and by virtue of the knowledge of the distance between the second focal plane and a first focal plane, which corresponds to the focal plane of the imaging device, and a nominal position of the object, it is possible to determine the deviation of the surface from the nominal surface of the object. The position of the object can be corrected for the deviation and the object can thus be positioned at the focus of the imaging device.

This method has the disadvantage that switching from the autofocusing device to the imaging device and back mechanically excites the system, which adversely influences the positioning of the object in the plane, that is to say in the x-, y-direction, and thus leads to measurement errors. Furthermore, for specific, in particular regular, object structures, during autofocusing onto such an object structure, a Moiré effect can occur between the object structure and the grating of the autofocus device, which makes it more difficult or impossible to determine the focus as a result of the contrast variation.

SUMMARY

An aspect of the present invention is to specify a method which eliminates the above-described disadvantages of the prior art.

This aspect is achieved by use of a method having the features of the independent claim. The dependent claims relate to advantageous developments and variants of the invention.

An autofocusing method according to the invention for an imaging device (for semiconductor lithography) comprising an imaging optical unit, an object to be measured and an autofocusing device having a reflective illumination, comprises the following method steps:
 a) defining a plurality of basis measurement points $M(x_j, y_j)$ on a surface of the object,
 b) determining the deviation $A_{z(M)j}$ of a nominal position of the surface of the object from the focal plane of the autofocusing device at the defined basis measurement points $M(x_j, y_j)$,
 c) storing the deviations $A_{z(M)j}$ from at least three basis measurement points $M(x_j, y_j)$,
 d) using the stored deviation $A_{z(M)j}$ for determining a deviation $A_{z(P)k}$ at an arbitrary point $P(x_k, y_k)$ of the surface, and
 e) using the deviation $A_{z(P)k}$ for focusing onto the point $P(x_k, y_k)$.

The imaging device can be embodied as a microscope, for example, which is used for assessing objects embodied as photomasks, which are also referred to as reticles. Structures are arranged on the photomasks, which structures are imaged onto wafers for the purpose of producing integrated circuits in projection exposure apparatuses. The photomasks must not have any defects in the structures since the latter would be copied to all of the circuits, for which reason the photomasks are checked very accurately for defects. To that end, at least partial regions of the photomasks which have been identified beforehand by other measuring machines, for example, are assessed using the microscope. In this case, the structures on the photomask have to be able to be measured in the subnanometers range with regard to their location.

The relationship with the z-accuracy is afforded by way of the telecentricity (="oblique illumination") of the system. If the illumination is not exactly centric, but rather has, e.g., a small angle of 10 mrad with the normal to the surface of the photomask, then a defocus of the mask of dz=10 nm will be translated into a position error of the measured structure of 10 mrad*10 nm=0.1 nm. It is thus advantageous if the accuracy of the focusing, that is to say of the z-direction, is in the range of 1-50 nm, in particular in the range of 1-20 nm. To that end, firstly the deviations $A_{z(M)j}$ of the surface from a nominal surface are ascertained, which deviations can be used for focusing given a known position of the object with respect to the imaging device and thus with respect to the focal point of the imaging optical unit.

In order to achieve the required accuracies of the focusing, for example only basis measurement points $M(x_j, y_j)$ are used for which a deviation $A_{z(M)j}$ can be determined with a required accuracy. By way of example, a plurality of points on the surface of the photomask can be moved to and measured without knowledge of the structures present there. Irrespective of whether or not the location moved to has a structure, on the basis of the evaluation of the autofocusing a decision can be taken as to whether the deviation $A_{z(M)j}$ was able to be determined sufficiently accurately. In particular, it is possible to establish whether no corrupting Moiré effects are present. Only then is the deviation $A_{z(M)j}$ stored for this point $M(x_j, y_j)$. In this case, care should be taken to ensure that the number of measurements with sufficient accuracy is in a tenable ratio with respect to the number of all the measurements carried out.

In particular, the design description of the object can also be taken into account in the definition of the basis measurement points.

In this regard, by way of example, only points on the object which have no structures can be taken into account in the definition of the basis measurement points $M(x_j, y_j)$. This has the advantage that an influence of the structures on the surface of the object has no influence on the accuracy of the determination of the deviation $A_{z(M)j}$ and only the same number of measurements as the required number of basis measurement points need be carried out. To that end, accurate knowledge of the location and type of the structures of the photomask is required in advance of the measurement, which often are known only to the manufacturer. Thus, in such a case, the basis measurement points $M(x_j, y_j)$ can also be defined by the manufacturer of the photomask. In a further variant, by way of example, locations on the separating lines between the structured regions, at which the finished processed wafer is separated into individual circuits later, can also be used as basis measurement points $M(x_j, y_j)$ since no structures are situated in these so-called trenches. A check of the accuracy of the determination of the deviation $A_{z(M)j}$ as described further above can furthermore be carried out for quality assurance. Once a sufficient number of basis measurement points $M(x_j, y_j)$ have been determined with sufficient accuracy and stored, the actual observation of the photomask can be begun.

In one variant of the method, during the imaging of a point $P(x_k, y_k)$ of the surface by use of the imaging optical unit, the deviation $A_{z(P)k}$ is interpolated on the basis of the stored deviations $A_{z(M)j}$.

In particular, the interpolation for predicting the deviation $A_{z(P)k}$ for arbitrary points $P(x_k, y_k)$ on the surface of the object can be based on a linear or polynomial interpolation model or an interpolation model based on a thin plate basis function, a Legendre polynomial or a Zernike polynomial.

A suitable method for interpolation can be chosen depending on the defects occurring on the surface of the photomask. By way of example, if the surface defects of the photomask are of long-wave nature, then a third- or fifth-order polynomial may already suffice to predict the surface on the basis of the basis measurement points $M(x_j, y_j)$ accurately enough that the deviation can satisfy the accuracy requirements for the deviation $A_{z(P)k}$.

The type of surface defects is usually known in advance, such that for example the deviations $A_{z(M)j}$ are determined only for as many basis measurement points $M(x_j, y_j)$ as are needed for the interpolation which describes the surface defect sufficiently accurately. In the case of a fifth-order interpolation, 6×6 measurements are sufficient. In the case of a measurement of 15×15 to 20×20 points on the mask, the number of focusing measurements is advantageously minimized.

By virtue of the fact that the focusing measurement has to be carried out only once, for example the method described can be carried out before the actual measurement of the object in the imaging device.

In particular, the method can be carried out during the temperature regulation and/or stabilization of the imaging device. After the object has been inserted, on account of the subnanometer requirements with regard to positioning in the x-, y-plane, before the first measurement, for a certain time, which is for example 15 min, in particular 10 min, in particular 1 min, the system has to be subjected to temperature regulation and the positioning has to be stabilized. This so-called soaking time can therefore be used for the measurement of the basis measurement points $M(x_j, y_j)$. As a result of the long-wave defects of the surface in the z-direction, the deviation of the x-, y-position during the measurement causes only a negligible error in the deviation $A_{z(M)j}$. Consequently, not only is the focusing time saved before each measurement at a point $P(x_k, y_k)$, but in addition the soaking time after the object has been inserted into the imaging device is advantageously used for the measurement of the deviations $A_{z(M)j}$ at the basis measurement points $M(x_j, y_j)$.

In one variant of the method, the deviations $A_{z(P)k}$ for each measurement point $P(x_k, y_k)$ can be corrected by a correction value $\Delta A_k$ during operation. As a result of the operation of the imaging device and external influences, the surface of the object can change to an extent that cannot be disregarded. In this case, the change in the surface of the object has a uniform effect, that is to say that the deviations $A_{z(P)k}$ at different points $P(x_k, y_k)$ of the surface change by the same absolute value. In this case, the correction of the deviation $A_{z(P)k}$ using the correction value $\Delta A_k$ is independent of the ascertainment of the deviation $A_{z(P)k}$ itself. It is also conceivable for the surface to have been measured exactly by an interferometer, for example, before insertion into the imaging device, such that for each measurement point $P(x_k, y_k)$ a deviation $A_{z(P)k}$ is stored in a table. For this case, too, the correction of the deviation $A_{z(P)k}$ can be applied as described below.

In particular, the correction value $\Delta A_k$ can be determined on the basis of changes of pressure, temperature, air humidity or mechanical drift. The influence on the surface of the object by these parameters can be determined in advance, wherein the parameters can be detected by use of suitable sensors in the imaging device both during the determination of the deviation $A_{z(M)j}$ of the basis measurement points $M(x_j, y_j)$ and during the assessment of the measurement points $P(x_k, y_k)$. With the aid of suitable models, a correction value $\Delta A_k$ can be determined from the data detected by use of the sensors and can be added to the interpolated deviation $A_{z(P)k}$.

In addition, the correction value $\Delta A_k$ can be determined on the basis of a focus measurement of the imaging device.

In particular, the correction value $\Delta A_k$ for the interpolated deviations $A_{z(P)k}$ at a measurement point $P(x_k, y_k)$ can be determined on the basis of a focus measurement at the previous measurement point $P_{k-1}$. For the assessment of the partial regions of the objects, a so-called defocus stack, that is to say a multiplicity of measurements for different focus locations, is usually carried out. The best focus is determined from this stack of measurements. The best focus measured by the imaging device, that is to say the focus at which the surface of the object is at the focal point of the imaging optical unit, can in turn be converted into a deviation $A_{ztrue(P)k}$ and be compared with the deviation $A_{z(P)k}$ determined from the interpolation for the same point. The difference between the two deviations $A_{z(P)k}$, $A_{ztrue(P)k}$ yields a correction value $\Delta A_k$ for the measurement point $P(x_k, y_k)$ at the point in time $t_0$. For the next measurement point $P(x_k, y_k)$ at the point in time $t_1$, wherein the value for k has been increased by 1, the deviation $A_{z(P)k}$ calculated from the interpolation can be corrected by the correction value $\Delta A_{k-1}$, that is to say the measurement at the point in time $t_0$ at the measurement point $P(x_{k-1}, y_{k-1})$. This leads to a minimization of the errors as a result of a change in the ambient conditions over the time period between the point in time $t_0$ of the last measurement and the point in time $t_1$ of the current measurement. The changes in the ambient conditions concern the entire surface, that is to say that no significant local changes as a result of ambient conditions occur on the object, such that the correction values $\Delta A_k$ of the individual measurement points $P(x_k, y_k)$ are likewise valid for all other measurement points.

The correction value $\Delta A_k$ can thus be summed recursively, for example, such that for the next measurement the difference $\Delta D_k$ between the deviations $A_{z(P)k}$ and $A_{ztune(P)k}$, said difference being ascertained during the current measurement, is added in each case to the last correction value $\Delta A_{k-1}$, wherein the deviation $A_{z(P)k}$ is composed of the interpolated value on the basis of the unchanged deviation $A_{z(M)j}$ and the correction value $\Delta A_{k-1}$. Alternatively, the ascertained differences $\Delta D_k$ could also be added recursively to the deviations $A_{z(M)j}$ determined at the beginning, such that these are already taken into account in the interpolation of the deviation $A_{z(P)k}$. This method has the advantage that changes in the surface of the object as a result of ambient influences are also detected during the measurement and taken into account in the determination of the focus value.

In one embodiment of the invention, the object can be embodied as a photomask of a projection exposure apparatus for semiconductor lithography.

In addition, the object can be embodied as a substrate for a photomask of a projection exposure apparatus for semiconductor lithography. By use of the method described above, a substrate can be measured and possible defects such as inclusions or elevations on the surface in the X- and Y-plane can be detected with an accuracy in the subnanometers range. As a result, it is possible later, for example, to arrange the structures on the substrate such that no structures lie on the defects or the non-reflective part of the structure, the so-called absorber, can be positioned on the defects.

BRIEF DESCRIPTION OF DRAWINGS

Exemplary embodiments and variants of the invention are explained in more detail below with reference to the drawing. In the figures.

DETAILED DESCRIPTION

Figure 1:
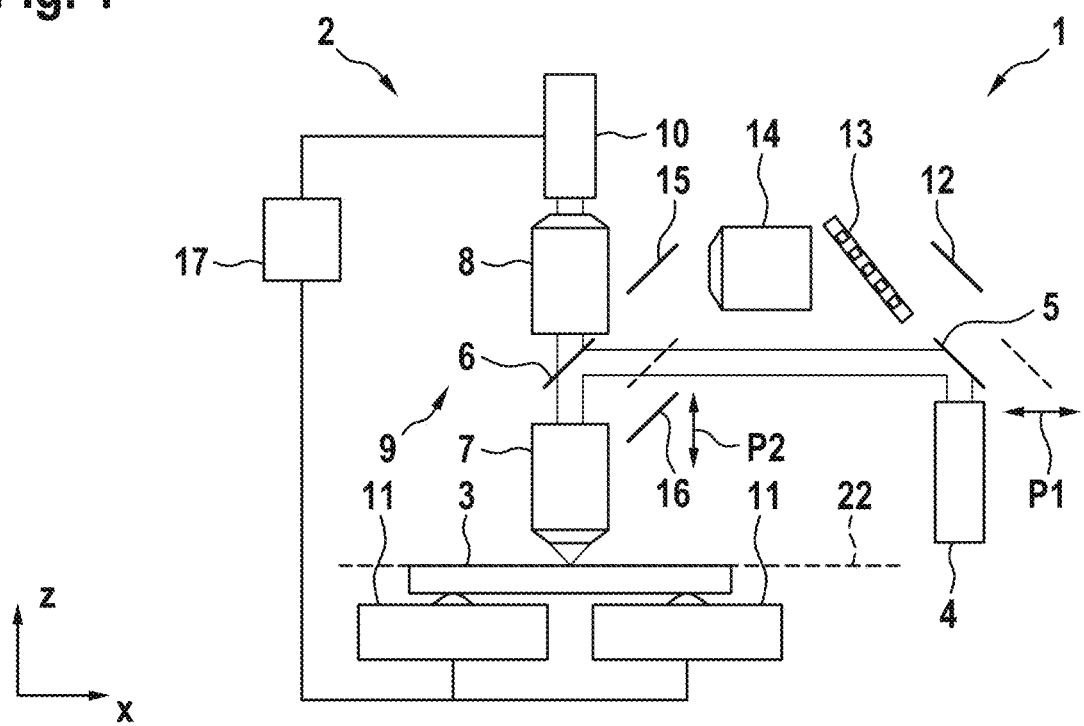
FIG. 1 shows a schematic illustration of an imaging device according to the prior art.

FIG. 1 shows an embodiment of an autofocusing device 1 as known from the prior art, said autofocusing device being arranged in an imaging device for examining an object embodied as a lithography mask 3, said imaging device being embodied as a microscope 2. The microscope 2 comprises an illumination source 4, which emits incoherent, coherent or partially coherent illumination radiation having a wavelength of 193 nm. The illumination radiation is guided via a first deflection mirror 5 and a second deflection mirror 6 to the imaging objective 7 and is directed by use of the latter onto the lithography mask 3 for illumination purposes.

The object 3 is imaged by way of the imaging objective 7, the partly transparent deflection mirror 6 and also a tube optical unit 8, which together form an imaging optical unit 9, onto a CCD camera 10 in order to generate an image of a part of the object 3. By way of example, the lateral position of alignment marks of the lithography mask 3 can be determined highly accurately by use of the microscope 2. A CMOS camera or some other image sensor can also be used instead of a CCD camera.

The microscope 2 furthermore has an object stage 11, by use of which the object 3 can be positioned both laterally and in the observation direction, that is to say in the z-direction. As a result, the object 3 can be positioned such that it is situated at the focus of the imaging device 2, that is to say the focal plane 22 of the imaging device 2, said focal plane being indicated in a dashed manner.

The autofocusing device 1 uses the illumination source 4 and also the imaging objective 7 of the microscope 2 for illuminating the object 3 with a focusing image and uses the imaging objective 7, the tube optical unit 8 and the CCD camera 9 for recording the focusing image.

To that end, firstly the first deflection mirror 5 and secondly the deflection mirror 16 are embodied as displaceable, which is indicated by the double-headed arrows P1 and P2 in FIG. 1.

In contrast to the example shown, the imaging device 2 can also be operated in transmission as long as only the autofocusing device 1 is used in reflection.

Figure 2:
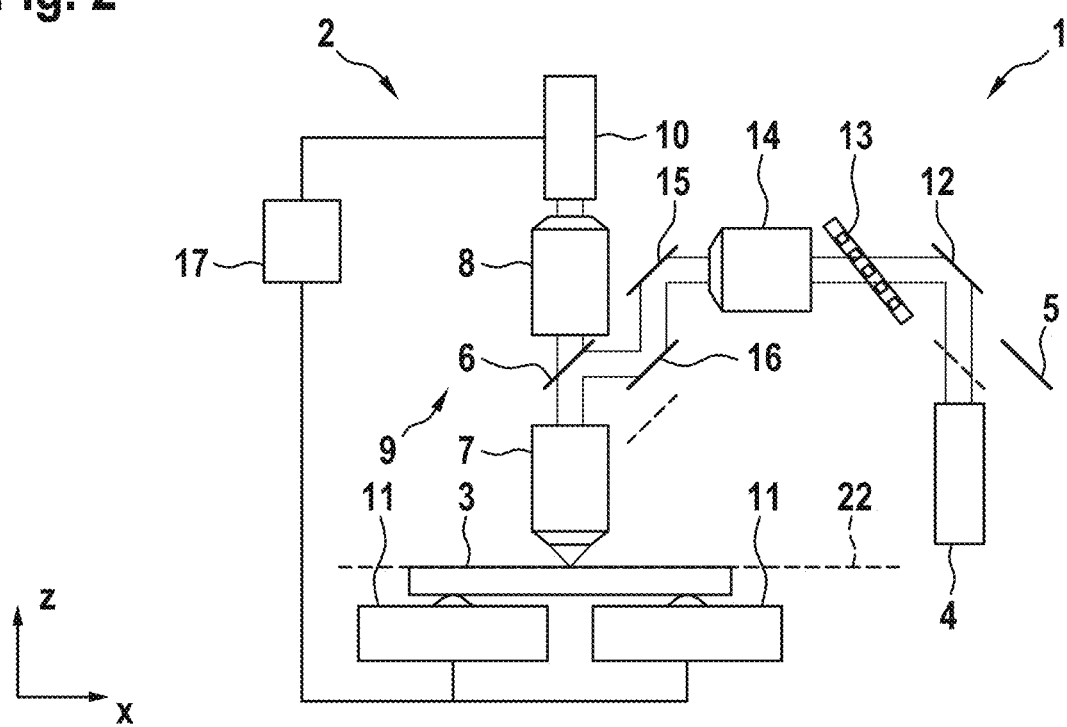
FIG. 2 shows a further schematic illustration of an imaging device according to the prior art.

FIG. 2 shows the same imaging device 2 during autofocusing operation. In this case, the deflection mirror 5 is moved out of the beam path of the illumination radiation coming from the illumination source 4, such that the illumination radiation is incident on a third deflection mirror 12, which directs the illumination radiation through a grating 13 tilted by 45° relative to the direction of propagation of the illumination radiation. However, the tilt angle can also be any other angle from the range of 1-89°. The deflection mirror 16 is displaced such that the grating structure is imaged by way of an autofocus optical unit 14, a further deflection mirror 15 and the deflection mirror 16 onto the second deflection mirror 6 and also through the imaging objective 7 onto the object 3.

The grating 13 can be embodied for example as a line grating having alternately transparent strips and nontransparent strips. The grating extends periodically in the x-direction.

For the purpose of focusing, that is to say positioning the object 3 into the focal plane 22 of the imaging device 2, the object is positioned in its nominal position at the focus of the imaging device 2. The surface deviations of the object 3 are in a range of a few μm, wherein the accuracy of the focus measurement is between 1 and 50 nm. This has the effect that the surface of the object 3 is usually not situated at the focus in the case of a nominal positioning. In order to determine the deviation of the surface from the nominal surface, the aerial image of the grating structure that is imaged on the CCD detector of the CCD camera 10 is fed to a control unit 17 of the autofocusing device 1. The control unit 17 determines the deviation of the surface of the object 3 from the nominal position thereof on the basis of an intensity distribution. This is used to drive the object stage 11 such that that region of the object 3 which is intended to be measured is positioned at the focus of the imaging device 2.

Figure 3:
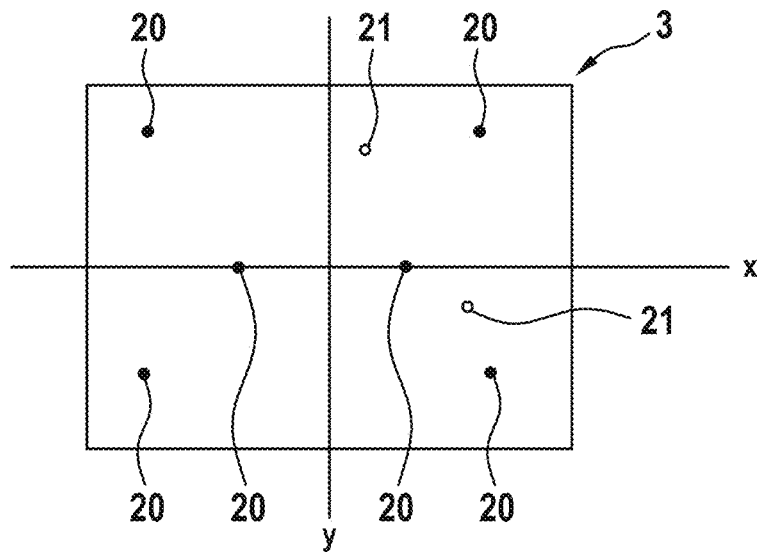
FIG. 3 shows a schematic illustration of a photomask in a plan view.

FIG. 3 shows an object 3 embodied as a lithography mask 3 with an x-axis and a y-axis, six basis measurement points 20 being arranged on said object. For said basis measurement points 20, the deviation $A_{z(M)j}$ of the surface in the z-direction is determined in each case. This can be determined according to a method known from the prior art as described with reference to FIG. 1 and FIG. 2, but any other highly accurate determination of the deviation $A_{z(M)j}$ of the surface from its nominal form, such as by use of an interferometer, for example, can also be used for this purpose. The deviations $A_{z(M)j}$ thus determined are stored for each basis measurement point $M(x_j, y_j)$, thus giving rise to a table having deviations $A_{z(M)j}$ at the basis measurement points $M(x_j, y_j)$. FIG. 3 furthermore also shows two measurement points 21 $P(x_k, y_k)$ illustrated as circles left blank, said measurement points representing by way of example measurement points 21 at which a measurement is intended to be carried out by the imaging device 2. For the purpose of focusing the object 3 in the imaging device 2, which is not illustrated in FIG. 3, the deviation $A_{z(P)k}$ of the surface at the measurement points $P(x_k, y_k)$ must be known. In contrast to the prior art, the deviation $A_{z(P)k}$ is not determined by use of a focusing method known from the prior art directly before the measurement, but rather is interpolated from the deviations $A_{z(M)j}$ of the basis measurement points 20 $M(x_j, y_j)$. In the case of long-wave defects of the surface of the object 3, for example a fifth-order interpolation polynomial can already determine the deviation $A_{z(P)k}$ sufficiently accurately. Depending on the surface shape, the prediction of the deviation $A_{z(P)k}$ can also be based on a linear or some other polynomial interpolation model, such as, for example, a third- or seventh-order one or an interpolation model based on a thin plate basis function, a Legendre polynomial or a Zernike polynomial. In this case, the number of basis measurement points 20 required for a prediction depends on the interpolation model used. This method has the advantage that the time for focusing can be reduced to a minimum.

Figure 4:
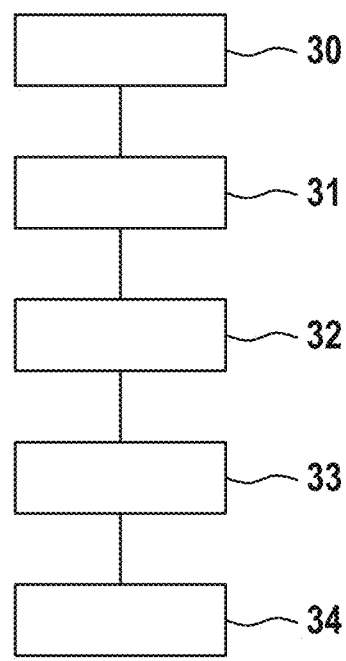
FIG. 4 shows a flow diagram concerning a method according to the invention.

FIG. 4 describes a possible autofocusing method for an imaging device.

The first method step 30 involves defining at least three basis measurement points 20 $M(x_j, y_j)$ on a surface of the object.

A second method step 31 involves determining the deviation $A_{z(M)j}$ of a nominal position of the surface of the object 3 from the focal plane of the autofocusing device at the defined basis measurement points 20 $M(x_j, y_j)$.

A third method step 32 involves storing the deviations $A_{z(M)j}$ from at least three basis measurement points 20 $M(x_j, y_j)$.

A fourth method step 33 involves using the stored deviations $A_{z(M)j}$ for interpolating a deviation $A_{z(P)k}$ at an arbitrary point 21 $P(x_k, y_k)$ of the surface.

A fifth method step 34 involves focusing onto the point 21 $P(x_k, y_k)$.

This method reduces the time for focusing to a minimum and avoids an excitation of the imaging device, such as, for example, as a result of a pivoting-in of deflection mirrors 5, 16 during the measurement of the partial regions of the objects.

LIST OF REFERENCE SIGNS

1 Autofocusing device
2 Microscope
3 Lithography mask
4 Illumination source
5 First deflection mirror
6 Second deflection mirror
7 Imaging objective
8 Tube optical unit
9 Imaging optical unit
10 CCD camera
11 Object stage
12 Third deflection mirror
13 Grating
14 Autofocus optical unit
15 Further deflection mirror
16 Further deflection mirror
17 Control unit
20 Basis measurement points $M(x_j, y_j)$
21 Measurement points $P(x_k, y_k)$
22 Focal plane
30 Method step 1
31 Method step 2
32 Method step 3
33 Method step 4
34 Method step 5

What is claimed is:

1. An autofocusing method for an imaging device (for semiconductor lithography) comprising an imaging optical unit, an object to be measured and an autofocusing device having a reflective illumination, comprising the following method steps:
    a) defining at least three basis measurement points $M(x_j, y_j)$ on a surface of the object,
    b) determining a deviation $A_{z(M)j}$ of a nominal position of the surface of the object from a focal plane of the autofocusing device at each of the defined basis measurement points $M(x_j, y_j)$,
    c) storing the deviations $A_{z(M)j}$ from the defined basis measurement points $M(x_j, y_j)$,
    d) using the stored deviation $A_{z(M)j}$ for determining a deviation $A_{z(P)k}$ at an arbitrary point $P(x_k, y_k)$ of the surface different from the defined basis measurement points, and
    e) using the deviation $A_{z(P)k}$ for focusing onto the point $P(x_k, y_k)$.

2. The autofocusing method of claim 1,
    wherein only basis measurement points $M(x_j, y_j)$ are used for which a deviation $A_{z(M)j}$ can be determined with a required accuracy.

3. The autofocusing method of claim 2,
    wherein a design description of the object is taken into account in the definition of the basis measurement points.

4. The autofocusing method of claim 2,
    wherein only points without structures are taken into account in the definition of the basis measurement points $M(x_j, y_j)$.

5. The autofocusing method of claim 2,
    wherein during the imaging of a point $P(x_k, y_k)$ of the surface by use of the imaging optical unit, the deviation $A_{z(P)k}$ is interpolated on the basis of the stored deviations $A_{z(M)j}$ and is taken into account in the focusing.

6. The autofocusing method of claim 2,
wherein the deviation $A_{z(P)k}$ for at least one measurement point $P(x_k, y_k)$ is corrected by a correction value $\Delta A_k$ during operation.

7. The autofocusing method of claim 2,
wherein the object is embodied as a photomask of a projection exposure apparatus for semiconductor lithography.

8. The autofocusing method of claim 1,
wherein only points without structures are taken into account in the definition of the basis measurement points $M(x_j, y_j)$.

9. The autofocusing method of claim 1,
wherein during the imaging of a point $P(x_k, y_k)$ of the surface by use of the imaging optical unit, the deviation $A_{z(P)k}$ is interpolated on the basis of the stored deviations $A_{z(M)j}$ and is taken into account in the focusing.

10. The autofocusing method of claim 9,
wherein the interpolation for predicting the deviation $A_{z(P)}$ for arbitrary points $P(x_k, y_k)$ on the surface of the object is based on a linear or polynomial interpolation model or an interpolation model based on a thin plate basis function, a Legendre polynomial or a Zernike polynomial.

11. The autofocusing method of claim 9,
wherein the deviations $A_{z(M)j}$ are determined only for as many basis measurement points $M(x_j, y_j)$ as are needed for the interpolation.

12. The autofocusing method of claim 1,
wherein the method is carried out before the actual measurement of the object in the imaging device.

13. The autofocusing method of claim 12,
wherein the method is carried out during the temperature regulation and/or stabilization of the imaging device.

14. The autofocusing method of claim 1,
wherein the deviation $A_{z(P)k}$ for at least one measurement point $P(x_k, y_k)$ is corrected by a correction value $\Delta A_k$ during operation.

15. The autofocusing method of claim 14,
wherein the correction value $\Delta A_k$ is determined on the basis of changes of pressure, temperature, air humidity or mechanical drift.

16. The autofocusing method of claim 14,
wherein the correction value $\Delta A_k$ is determined on the basis of a focus measurement of the imaging device.

17. The autofocusing method of claim 16,
wherein the correction value $\Delta A_k$ for the interpolated deviations $A_{z(P)k}$ at a measurement point $P(x_k, Y_k)$ is determined on the basis of a focus measurement at the previous measurement point $P(x_{k-1}, y_{k-1})$.

18. The autofocusing method of claim 17,
wherein the correction value $\Delta A_k$ is summed recursively.

19. The autofocusing method of claim 1,
wherein the object is embodied as a photomask of a projection exposure apparatus for semiconductor lithography.

20. The autofocusing method of claim 1,
wherein the object is embodied as a substrate for a photomask of a projection exposure apparatus for semiconductor lithography.

* * * * *

UNITED STATES PATENT AND TRADEMARK OFFICE
CERTIFICATE OF CORRECTION

PATENT NO. : 11,947,185 B2  
APPLICATION NO. : 17/521230  
DATED : April 2, 2024  
INVENTOR(S) : Dirk Seidel Page 1 of 1

It is certified that error appears in the above-identified patent and that said Letters Patent is hereby corrected as shown below:

On the Title Page

Item [57], Line 15, delete "$P(x_k, Y_k)$" and insert -- $P(x_k, y_k)$ --  
Item [57], Line 18, delete "$P(x_k, Y_k)$" and insert -- $P(x_k, y_k)$ --

In the Specification

Column 5
Line 23, delete "$A_{ztune(P)k}$," and insert -- $A_{ztrue(P)k}$, --

Column 7
Line 5, delete "that that" and insert -- that --

In the Claims

Column 10
Line 17, in Claim 17, delete "$P(x_k, Y_k)$" and insert -- $P(x_k, y_k)$ --

Signed and Sealed this  
Ninth Day of July, 2024

Katherine Kelly Vidal  
*Director of the United States Patent and Trademark Office*